(12) United States Patent
Le et al.

(10) Patent No.: US 6,275,424 B1
(45) Date of Patent: Aug. 14, 2001

(54) REDUCTION OF VOLTAGE STRESS ACROSS A GATE OXIDE AND ACROSS A JUNCTION WITHIN A HIGH VOLTAGE TRANSISTOR OF AN ERASABLE MEMORY DEVICE

(75) Inventors: Binh Quang Le, Mountain View; Pauling Chen, Saratoga, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/774,509

(22) Filed: Jan. 31, 2001

Related U.S. Application Data

(62) Division of application No. 09/353,267, filed on Jul. 14, 1999, now Pat. No. 6,240,017.

(51) Int. Cl.$^7$ ..................................................... G11C 7/00
(52) U.S. Cl. .............................. 365/189.09; 365/189.18; 365/189.19
(58) Field of Search ........................ 365/185.18, 185.19, 365/185.27, 189.09

(56) References Cited

U.S. PATENT DOCUMENTS

| | | | | |
|---|---|---|---|---|
| 5,042,009 | * | 8/1991 | Kazerounian et al. | 365/185.19 |
| 6,040,996 | * | 3/2000 | Kong | 365/185.19 |

* cited by examiner

*Primary Examiner*—Son T. Dinh
(74) *Attorney, Agent, or Firm*—Monica H. Choi

(57) ABSTRACT

The present invention reduces the voltage across the gate oxide and across a junction of a high voltage MOSFET (Metal Oxide Semiconductor Field Effect Transistor) within an unselected block of an electrically erasable memory during an erase operation of a selected block of the electrically erasable memory. The drain node is coupled to each respective control gate node of a plurality of core cells disposed within a well. The present invention includes a voltage generator coupled to a gate node of the high voltage transistor and to the well having the core cells disposed therein. The present invention also includes a microcontroller that controls the voltage generator to ramp up a magnitude of a well voltage applied at the well from a start ramping time when the well voltage is at a start voltage to an end ramping time when the well voltage is at an end voltage. The mictocontroller also controls the voltage generator to couple the drain node of the high voltage MOSFET to a ground node having a ground voltage for a predetermined time period after the start ramping time. The well voltage reaches an intermediate voltage at the predetermined time period after the start ramping time. The microcontroller further controls the voltage generator to uncouple the drain node of the high voltage MOSFET from the ground node at the predetermined time period after the start ramping time. In this manner, the drain node of the high voltage MOSFET has a controlled voltage, with a magnitude that is substantially equal to a magnitude of the end voltage minus a magnitude of the intermediate voltage, at the end ramping time when the well voltage is at the end voltage.

11 Claims, 3 Drawing Sheets

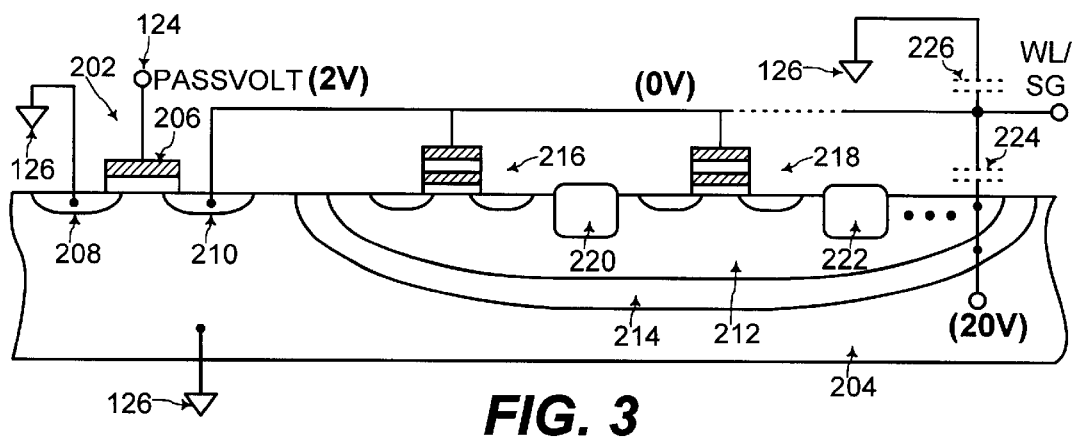
FIG. 3
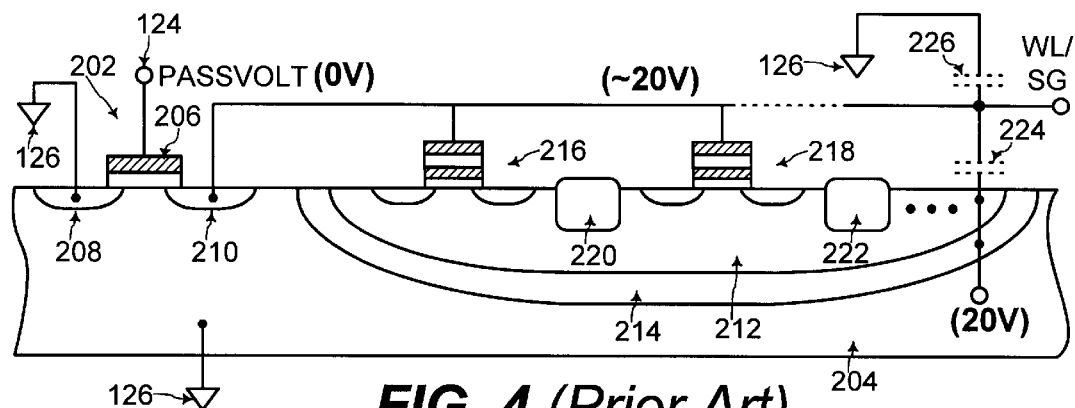
FIG. 4 *(Prior Art)*
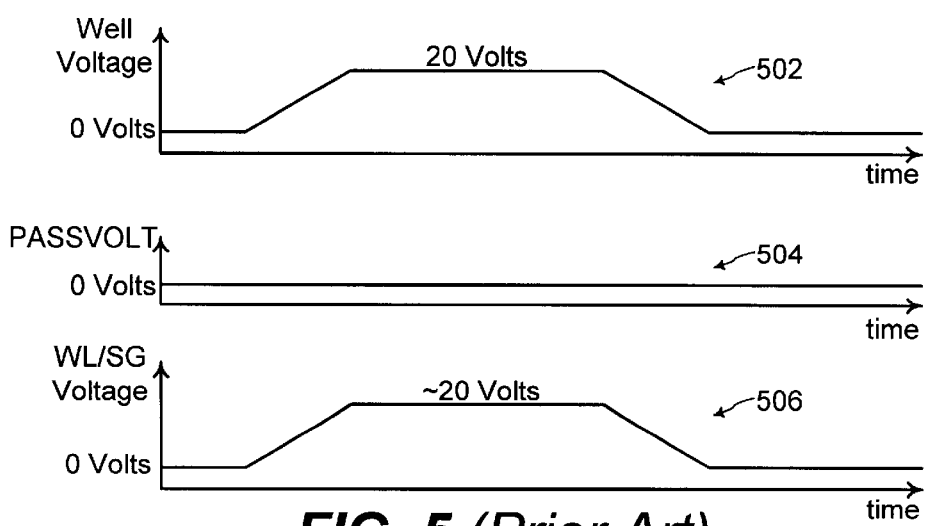
FIG. 5 *(Prior Art)*

REDUCTION OF VOLTAGE STRESS ACROSS A GATE OXIDE AND ACROSS A JUNCTION WITHIN A HIGH VOLTAGE TRANSISTOR OF AN ERASABLE MEMORY DEVICE

This is a divisional of an earlier filed copending application, with Ser. No. 09/353,267 filed on Jul. 14, 1999, now U.S. Pat. No. 6,240,017 for which priority is claimed. This earlier filed copending patent application with Ser. No. 09/353,267 is in its entirety incorporated herewith by reference.

TECHNICAL FIELD

The present invention relates generally to a NAND flash memory device which is an example electrically erasable memory device, and more particularly, to a method and apparatus for reducing voltage stress across the gate oxide and across a junction of a high voltage transistor within a block of such an electrically erasable memory device.

BACKGROUND OF THE INVENTION

Referring to FIG. 1, an example block 102 of a NAND flash memory device includes a first select gate 104 and a second select gate 106 and a plurality of word lines, as known to one of ordinary skill in the art of electronics. The example block 102 of the NAND flash memory device for example has a first word line 108, a second word line 110, and so on up to a sixteenth word line 112. A typical NAND flash memory device has a plurality of such a block 102. For example, a typical NAND flash memory device may have 1,024 instances of such a block 102.

Each of the select gates or the word lines of the block 102 are coupled to the drain node of a respective high voltage transistor. The first select gate 104 is coupled to the drain node of a first high voltage transistor 114, and the second select gate 106 is coupled to the drain node of a second high voltage transistor 116. Similarly, the first word line 108 is coupled to the drain node of a third high voltage transistor 118, the second word line 110 is coupled to the drain node of a fourth high voltage transistor 120, and so on with the sixteenth word line 112 being coupled to a respective high voltage transistor 122.

The gate node of each of the respective transistors coupled to the select gates or the word lines within the block 102 is coupled to a PASSVOLT node 124. Each of the plurality of blocks of a NAND flash memory device has a separate respective PASSVOLT node.

The respective source node of each of the high voltage transistors within the block 102 is coupled to a respective vertical decode line of the NAND flash memory device, as known to one of ordinary skill in the art of electronics. The source node of the first high voltage transistor 114 is coupled to a first vertical decode line 115, the source node of the second high voltage transistor 116 is coupled to a second vertical decode line 117, the source node of the third high voltage transistor 118 is coupled to a third vertical decode line 119, the source node of the fourth high voltage transistor 120 is coupled to a fourth vertical decode line 121, and so on with the high voltage transistor 122 being coupled to a respective vertical decode line 123. As known to one of ordinary skill in the art of electronics, each of the vertical decode lines are coupled to the source of each of a respective high voltage transistor from each of a plurality of blocks of the NAND flash memory device. During an erase operation of a block of the NAND flash memory device, all of the vertical decode lines 115, 117, 119, 121, and so on to 123 are coupled to ground.

Each of the select gates and the word lines within the block 102 of a NAND flash memory device is coupled to a plurality of core cells which may be a plurality of floating gate devices, as known to one of ordinary skill in the art of electronics. The control gate node of each of the plurality of core cells is coupled to a select gate or a word line within the block 102.

Referring to FIG. 2, the cross-sectional view of an example high voltage transistor 202 within the block 102 is coupled to a respective plurality of core cells. Elements having the same reference number in FIGS. 1 and 2 refer to elements having similar structure and function. The example high voltage transistor 202 is within a semiconductor substrate 204. The high voltage transistor 202 has a gate node 206 coupled to the PASSVOLT node 124 and has a source node 208 coupled to a ground node 126 during an erase operation of a block within the NAND flash memory device. A drain node 210 of the high voltage transistor 202 is coupled to the respective select gate line or the word line within the block 102.

A core cell within the first well 212 of FIG. 2 is a floating gate device, as known to one of ordinary skill in the art of electronics. The drain node 210 (and the respective select gate or word line) of the high voltage transistor 202 is coupled to each of the control gate node of a plurality of core cells disposed within a first well 212. The drain node 210 of the high voltage transistor 202 of the block 102 may be coupled to each of the control gate node of approximately 4,000 core cells disposed within the first well 212 for example. In FIG. 2, just a first core cell 216 and a second core cell 218 are shown for clarity of illustration. Field oxide regions may isolate the core cells within the first well 212. Just a first field oxide region 220 and a second field oxide region 222 within the first well 212 are shown in FIG. 2 for clarity of illustration. The first well 212 is disposed within a second well 214 that separates the first well 212 from the semiconductor substrate 204.

A first parasitic capacitor 224 is formed, between the first well 212 and the select gate or the word line. In addition, a second parasitic capacitor 226 is formed, between the drain node 210 forming the select gate or the word line and the semiconductor substrate 204, from the PN junction formed by the drain node 210 and the semiconductor substrate 204.

Referring to FIG. 2, the high voltage MOSFET 202 is an N-channel MOSFET, and the source node 208 and the drain node 210 are doped with an N-type dopant. The semiconductor substrate 204 is doped with a P-type dopant and is coupled to the ground node 126. The first well 212 is doped with a P-type dopant, the second well 214 is doped with an N-type dopant, and the core cells within the first well 212 are N-channel floating gate devices.

As known to one of ordinary skill in the art of electronics, the core cells within the first well 212 of the block 102 are programmed by charge injection into the floating gate node of each of the core cells. In an erase operation, such charge is discharged from the floating gate node of each of the core cells. The erase operation is performed for a whole block of the NAND flash memory device. On the other hand, any charge injected into the floating gate nodes within other blocks, that are not being erased within the NAND flash memory device, are preserved.

Referring to FIG. 3, the voltage applied to the devices of a block of the NAND flash memory device during an erase operation of that block is shown. Elements having the same reference number in FIGS. 1, 2, and 3 refer to elements having similar structure and function. For each high voltage transistor 202 within the block that is being erased, a turnon voltage of 2V is applied as the PASSVOLT to the gate node 206 of the high voltage transistor 202. The high voltage transistor 202 turns on such that the drain node 210 is coupled to the ground node 126 at the source node 208.

The select gate or the word line coupled to the drain node 210 is then also coupled to the ground node 126. Thus, the control gate node of the floating gate devices within the first well 212 are coupled to the ground node 126. A high voltage such as 20V for example is then applied to the first well 212 and the second well 214. Such a bias at the control gate node of the core cells and at the first well 212 pulls out any charge that is stored within the floating gate node of the core cells during the erase operation of the block having the high voltage transistor 202, as known to one of ordinary skill in the art of electronics.

Only a selected block of the NAND flash memory device has such biasing for an erase operation within such a selected block. The rest of the blocks of the NAND flash memory device are unselected blocks and are not erased. Any charge injected into the floating gate nodes of the core cells of such unselected blocks are preserved. Referring to FIG. 4, the voltage applied to the devices of an unselected block of the NAND flash memory device is shown. Elements having the same reference number in FIGS. 1, 2, 3, and 4 refer to elements having similar structure and function. For each high voltage transistor 202 within the block that is unselected, a turn-off voltage of 0V is applied as the PASSVOLT to the gate node 206 of the high voltage transistor 202. The high voltage transistor 202 turns off such that the drain node 210 is isolated from the ground node 126 at the source node 208.

The select gate or the word line coupled to the drain node 210 is coupled to the first parasitic capacitor 224 and the second parasitic capacitor 226. The first parasitic capacitor 224 and the second parasitic capacitor 226 form a voltage divider at the drain node 210. The capacitance of the first parasitic capacitor 224 is typically significantly greater than the capacitance of the second parasitic capacitor 226. For example, the capacitance of the first parasitic capacitor 224 may be approximately 0.5–1.0 pF (picoFarads) when the capacitance of the second parasitic capacitor 226 is 0.05 pF (picoFarads).

Thus, although the first parasitic capacitor 224 and the second parasitic capacitor 226 form a voltage divider at the drain node 210 of the high voltage transistor 202, the voltage at the drain node 210 substantially follows the voltage at the first well 212. As a result, referring to FIG. 4, the drain node 210 reaches the voltage of substantially 20V (i.e., ≈19.7V) when 20V is applied at the first well 212 because the word line or select gate charges up to the voltage of substantially 20V (i.e., ≈19.7V). The control gate nodes of the core cells within the first well 212 are biased at substantially 20V (i.e., ≈19.7V). Such a bias at the control gate nodes of the core cells and at the first well 212 preserves any charge that is stored within the floating gate nodes of the core cells for the unselected block of the NAND flash memory device.

Referring to FIG. 5, a well voltage waveform 502 illustrates the voltage applied at the first well 212 and the second well 214 for an unselected block of the NAND flash memory device such that the unselected block is not erased. A PASSVOLT waveform 504 illustrates the voltage applied as the PASSVOLT at the gate node 206 of each of the high voltage transistors of the unselected block. A WL/SG voltage waveform 506 illustrates that the voltage formed at the drain node 210 of the high voltage transistor of the unselected block substantially follows the well voltage waveform 502 applied at the first well 212 and the second well 214.

Referring to FIG. 4, in the prior art, the voltage difference across the gate oxide of the gate node 206 and the drain node 210 of the high voltage transistor 202 is 20V. In addition, the voltage difference across the PN-junction formed by the drain node 210 and the semiconductor substrate 204 of the high voltage transistor 202 is also 20V. For typical operation of a NAND flash memory device, a block within the NAND flash memory device may be subject to hundreds of thousands of erase cycles and thus hundreds of thousands of cycles of reapplication of the 20V across the gate oxide and across the PN-junction formed by the drain node 210 and the semiconductor substrate 204 of the high voltage transistor 202. A higher voltage across the gate oxide and across the PN-junction formed by the drain node 210 and the semiconductor substrate 204 of the high voltage transistor 202 during such cycles of reapplication of such a higher voltage leads to a faster degradation of the high voltage transistor 202.

Thus, a mechanism is desired for reducing the voltage across the gate oxide and across the PN-junction formed by the drain node 210 and the semiconductor substrate 204 of the high voltage transistor 202 of unselected blocks that are not erased during the erase cycles of the NAND flash memory device. Such a reduction in the voltage across the gate oxide and across the PN-junction formed by the drain node 210 and the semiconductor substrate 204 of the high voltage transistor 202 may prolong the usable life and preserve the functional integrity of the high voltage transistor of the NAND flash memory device.

SUMMARY OF THE INVENTION

Accordingly, a primary object of the present invention is to reduce the voltage across the gate oxide and across a PN-junction of a high voltage MOSFET (Metal Oxide Semiconductor Field Effect Transistor) within an unselected block of an electrically erasable memory during an erase operation of a selected block of the electrically erasable memory.

The present invention is a method and apparatus for biasing a drain node of the high voltage MOSFET within the unselected block of the electrically erasable memory. The drain node is coupled to each respective control gate node of a plurality of core cells disposed within a well. The present invention includes a voltage generator coupled to a gate node of the high voltage transistor and to the well having the core cells disposed therein. The present invention also includes a microcontroller that controls the voltage generator to ramp up a magnitude of a well voltage applied at the well from a start ramping time when the well voltage is at a start voltage to an end ramping time when the well voltage is at an end voltage. The microcontroller also controls the voltage generator to couple the drain node of the high voltage MOSFET to a ground node having a ground voltage for a predetermined time period after the start ramping time. The well voltage reaches an intermediate voltage at the predetermined time period after the start ramping time. The microcontroller further controls the voltage generator to uncouple the drain node of the high voltage MOSFET from the ground node at the predetermined time period after the start ramping time. The drain node of the high voltage MOSFET has a controlled voltage, with a magnitude that is substantially equal to a magnitude of the end voltage minus a magnitude of the intermediate voltage, at the end ramping time when the well voltage is at the end voltage.

In this manner, a controlled voltage having a lower magnitude is formed across the gate oxide and across a PN-junction of the high voltage MOSFET within an unselected block of an electrically erasable memory. Thus, the usable life and the functional integrity of the high voltage MOSFET and thus of the electrically erasable memory device may be prolonged.

These and other features and advantages of the present invention will be better understood by considering the following detailed description of the invention which is presented with the attached drawings.

BRIEF DESCRIPTION OF THE DRAWINGS

FIG. 3 shows the cross sectional view of FIG. 2 with proper biasing of the devices within a selected block that is being erased within the NAND flash memory device;

FIG. 4 shows the cross sectional view of FIG. 2 with biasing of the devices within an unselected block that is not being erased within the NAND flash memory device, according to the prior art;

FIG. 5 shows voltage waveforms applied and generated at the devices within an unselected block that is not being erased within the NAND flash memory device, according to the prior art;

The figures referred to herein are drawn for clarity of illustration and are not necessarily drawn to scale. Elements having the same reference number in FIGS. 1, 2, 3, 4, 5, 6, 7, and 8 refer to elements having similar structure and function.

DETAILED DESCRIPTION

Figure 1:
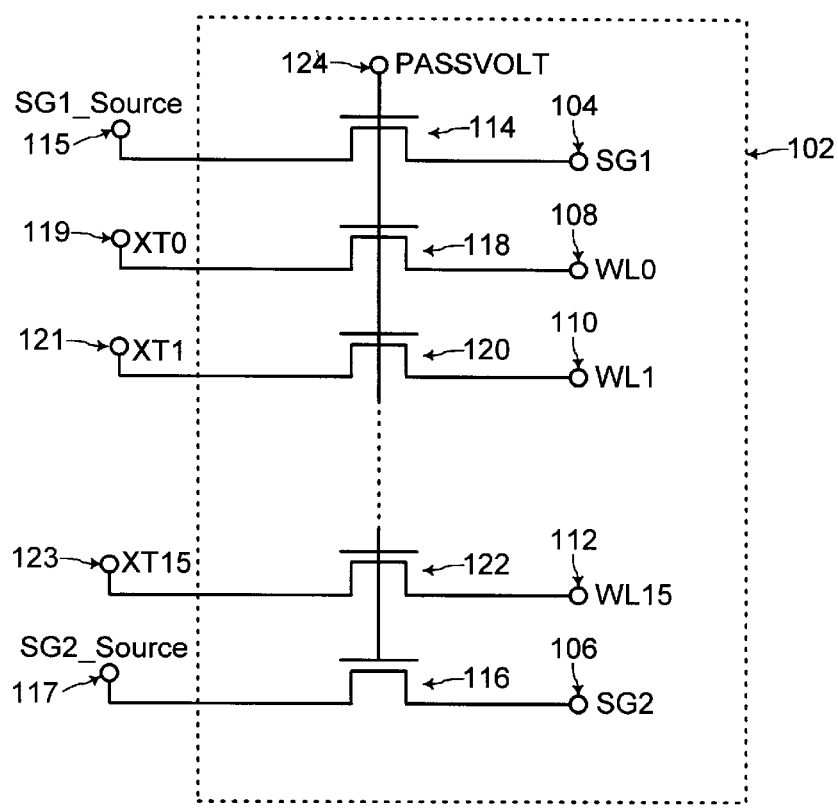
FIG. 1 shows an example block of an NAND flash memory device.
Figure 2:
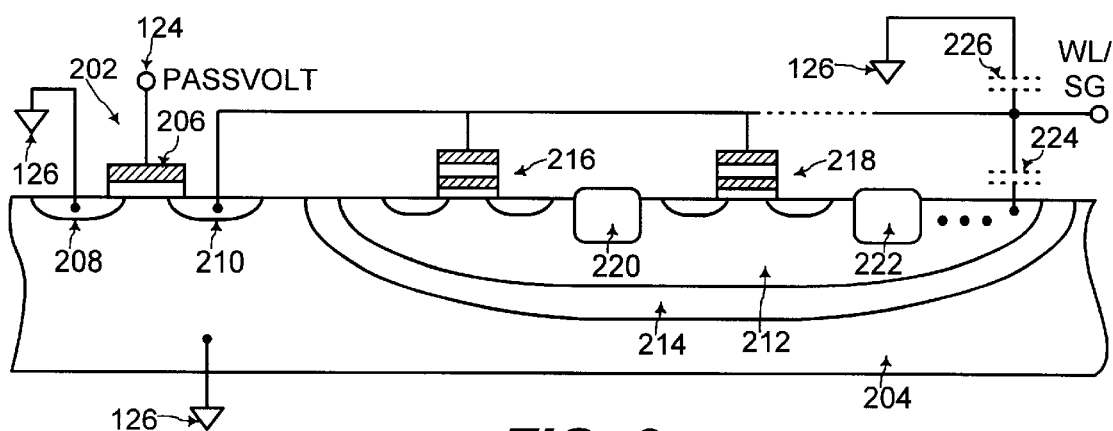
FIG. 2 shows a cross sectional view of an example high voltage transistor coupled to a plurality of core cells within a block of the NAND flash memory device.
Figure 6:
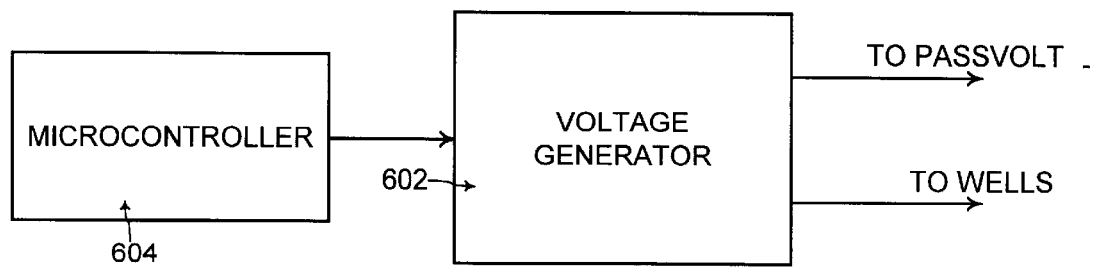
FIG. 6 shows the components of the present invention for reducing the voltage formed across the gate oxide and across a PN-junction of the high voltage MOSFET within an unselected block that is not being erased within the NAND flash memory device, according to the present invention.

The present invention controls the timing of the application of voltages to appropriate portions of devices within the unselected blocks that are not erased within a NAND flash memory device to reduce the voltage formed across the gate oxide and across a PN-junction of each of the high voltage MOSFETs within such unselected blocks. Referring to FIGS. 2 and 6, the present invention includes a voltage generator 602 coupled to the PASSVOLT node 124 and to the first well 212 and the second well 214. In addition, a microcontroller 604 is coupled to the voltage generator 602 for controlling the timing of the application of voltage waveforms at the PASSVOLT node 124 and at the first well 212 and the second well 214 by the voltage generator 602.

Figure 7:
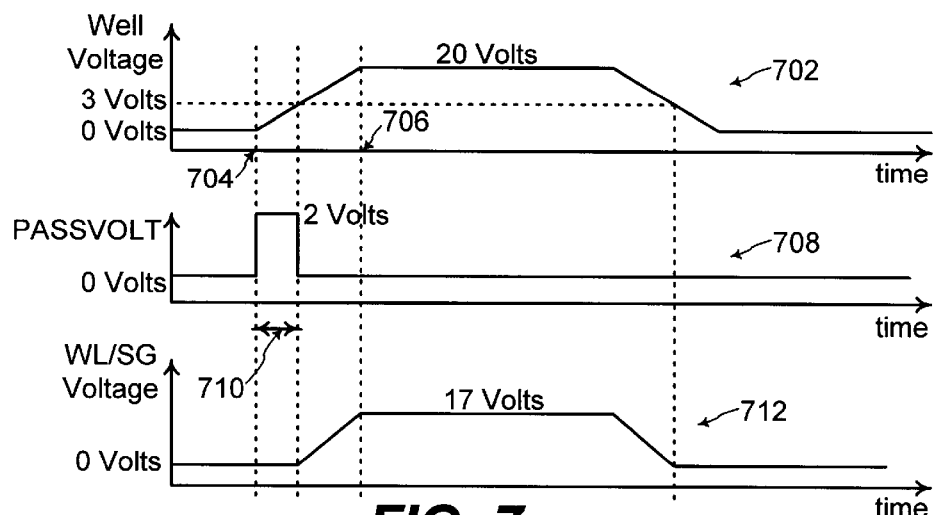
FIG. 7 shows voltage waveforms applied and generated at the devices within an unselected block that is not being erased within the NAND flash memory device, according to the present invention.
Figure 8:
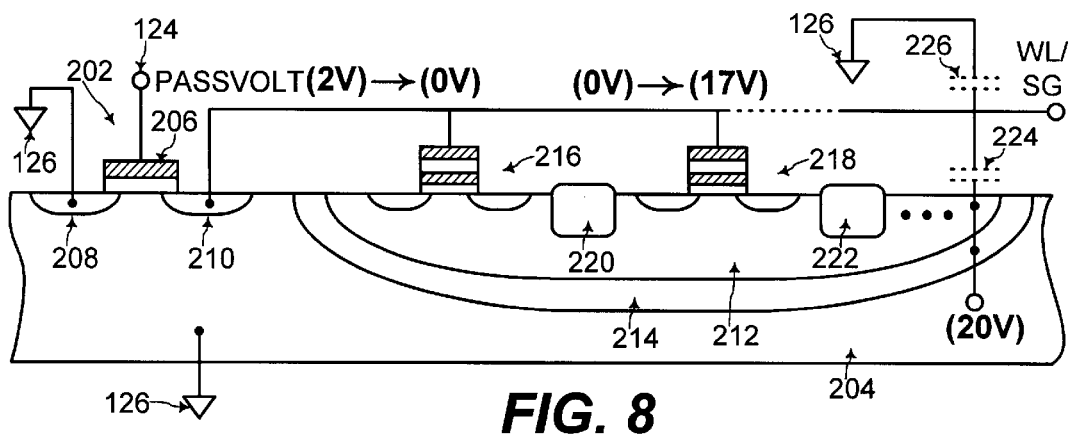
FIG. 8 shows the cross sectional view of FIG. 2 with biasing of the devices within an unselected block that is not being erased within the NAND flash memory device, according to the present invention.

Referring to FIG. 7, a well voltage form 702 is generated by the voltage generator 602. Referring to FIGS. 6, 7, and 8, the microcontroller 604 controls the voltage generator 602 to apply the well voltage 702 to the first well 212 and the second well 214. The microcontroller 604 controls the voltage generator 602 to ramp up a magnitude of the well voltage applied at the first well 212 and the second well 214 from a start ramping time 704 when the well voltage is at a start voltage (such as 0V for example) to an end ramping time 706 when the well voltage is at an end voltage (such as 20V for example).

Referring to FIG. 7, a PASSVOLT voltage form 708 is generated by the voltage generator 602. The microcontroller 604 controls the voltage generator 602 to apply a turn-on voltage (such as 2V for example) at the gate node 206 of the high voltage MOSFET 202 via the PASSVOLT node 124 for a predetermined time period 710 after the start ramping time 704. During this predetermined time period 710, the high voltage MOSFET 202 is turned on to couple the drain node 210 of the high voltage MOSFET 202 to the ground node 126 at the source node 208 for the predetermined time period 710 after the start ramping time 704. Referring to FIG. 7, note that the well voltage reaches an intermediate voltage (such as 3V for example) at the predetermined time period 710 after the start ramping time 704.

Referring to the PASSVOLT voltage form 708 of FIG. 7, at the predetermined time period 710 after the start ramping time 704, the PASSVOLT voltage turns back low. Thus, the gate node 206 of the high voltage MOSFET 202 is then biased with a turn-off voltage (such as 0V for example) at the predetermined time period 710 after the start ramping time 704. As a result, the high voltage MOSFET 202 is turned off to uncouple the drain node 210 of the high voltage MOSFET 202 from the ground node 126 at the predetermined time period 710 after the start ramping time 704. In this manner, the microcontroller 604 controls the voltage generator 602 to uncouple the drain node 710 of the high voltage MOSFET 202 from the ground node 126 at the predetermined time period 710 after the start ramping time 704.

Referring to FIGS. 6, 7, and 8, when the drain node 710 of the high voltage MOSFET 202 is uncoupled from the ground node 126 at the predetermined time period 710 after the start ramping time 704, the drain node 210 is floating. The first parasitic capacitor 224 and the second parasitic capacitor 226 form a voltage divider at the drain node 210. The capacitance of the first parasitic capacitor 224 is typically significantly greater than the capacitance of the second parasitic capacitor 226. Thus, the voltage at the drain node 210 substantially follows the voltage change at the first well 212.

As a result, referring to FIG. 7, a drain node voltage form 712 that is generated at the drain node 210 substantially follows the voltage change at the first well 212 after the predetermined time period 710. The voltage at the first well 212 is at the intermediate voltage of 3V at the end of the predetermined time period 710 and reaches 20V at the end ramping time 706. The voltage change at the first well 212 from the end of the predetermined time period 710 to the end ramping time 706 is then 17V. The drain voltage form 712 then ramps up from 0V at the end of the predetermined time period 710 to 17V at the end ramping time 706. In this manner, the drain node 710 of the high voltage MOSFET 202 has a controlled voltage at the end ramping time 706, with a magnitude that is substantially equal to a magnitude of the end voltage at the first well 212 at the end ramping time 706 minus a magnitude of the intermediate voltage at the first well 212 at the end of the predetermined time period 710.

Referring to FIG. 8, in contrast to the prior art, with the present invention, the voltage across the gate oxide and across the drain junction of the high voltage MOSFET 202 within an unselected block of an electrically erasable memory device is 17V instead of 20V. The voltage difference across the control gate node of the core cells and the first well 212 is 3V. Such a voltage is not high enough to significantly affect the charge injected into the floating gate node of the core cells within the first well 212, and thus the charge injected into the floating gate node of the core cells is preserved for the unselected blocks that are not erased within the NAND flash memory device. In addition, the reduction in the voltage across the gate oxide and across the drain junction of the high voltage MOSFET 202 to 17V instead of 20V results in slower degradation of the high voltage MOSFET 202.

Referring to FIG. 7, when the well voltage 702 ramps back down, the drain node voltage 712 follows the change in the well voltage 702 until the drain node voltage 712 reaches 0V. At that point, the drain node voltage 712 is clamped at approximately 0V because the PN junction formed by the drain node region 210 and the substrate 204 is forward biased for any negative drain node voltage 712.

The foregoing is by way of example only and is not intended to be limiting. For example, the present invention may be used for prolonging the usable life and the functional integrity of the high voltage transistor 202 that is part of any other type of erasable memory device aside from just the example of the NAND flash memory device. The present invention is particularly amenable for prolonging the usable life and the functional integrity of a high voltage transistor that is subject to high voltage bias. The present invention is limited only as defined in the following claims and equivalents thereof.

We claim:

1. An apparatus for biasing a drain node of a high voltage MOSFET (Metal Oxide Semiconductor Field Effect Transistor) within an unselected block of an electrically erasable memory, said drain node being coupled to each respective control gate node of a plurality of core cells disposed within a well, the apparatus comprising:

a voltage generator coupled to said well; and a microcontroller coupled to said voltage generator for controlling said voltage generator to ramp up a magnitude of a well voltage applied at said well from a start ramping time when the well voltage is at a start voltage to an end ramping time when the well voltage is at an end voltage;

and wherein said microcontroller controls said voltage generator to couple said drain node of said high voltage MOSFET to a ground node having a ground voltage for a predetermined time period after said start ramping time, said well voltage reaching an intermediate voltage at said predetermined time period after said start ramping time;

and wherein said microcontroller controls said voltage generator to uncouple said drain node of said high voltage MOSFET from said ground node at said predetermined time period after said start ramping time;

and wherein said drain node of said high voltage MOSFET has a controlled voltage, with a magnitude that is substantially equal to a magnitude of said end voltage minus a magnitude of said intermediate voltage, at said end ramping time when said well voltage is at said end voltage.

2. The apparatus of claim 1, wherein said drain node of said high voltage MOSFET is coupled to one of two select gates and sixteen word lines within said unselected block of said electrically erasable memory during an erase operation within a selected block of said electrically erasable memory.

3. The apparatus of claim 1, wherein a source node of said high voltage MOSFET is coupled to said ground node having said ground voltage, and wherein said voltage generator is coupled to a gate node of said high voltage MOSFET, and wherein said microcontroller controls said voltage generator to apply a turn-on voltage on said gate node of said high voltage MOSFET for said predetermined time period after said start ramping time such that said high voltage MOSFET is turned on to couple said drain node of said high voltage MOSFET to said ground node for said predetermined time period after said start ramping time.

4. The apparatus of claim 3, wherein said microcontroller controls said voltage generator to bias said gate node of said high voltage MOSFET with a turn-off voltage at said predetermined time period after said start ramping time such that said high voltage MOSFET is turned off to uncouple said drain node of said high voltage MOSFET from said ground node at said predetermined time period after said start ramping time.

5. The apparatus of claim 4, wherein said high voltage MOSFET is an N-channel MOSFET (Metal Oxide Semiconductor Field Effect Transistor) disposed within a p-type doped substrate, and wherein said plurality of core cells are N-channel floating gate devices disposed within a p-type doped well.

6. The apparatus of claim 5, wherein said start voltage is 0 Volts, wherein said end voltage is 20 Volts, wherein said intermediate voltage is 3 Volts, and wherein said controlled voltage is 17 Volts.

7. The apparatus of claim 6, wherein said p-type doped substrate is biased at 0 Volts, and wherein said gate node of said high voltage MOSFET is biased at 2 volts for said predetermined time period after said start ramping time, and wherein said gate node of said high voltage MOSFET is biased at 0 volts at said predetermined time period after said start ramping time.

8. An apparatus for biasing a drain node of a high voltage MOSFET (Metal Oxide Semiconductor Field Effect Transistor) within an unselected block of an electrically erasable memory, said drain node being coupled to each respective control gate node of a plurality of core cells disposed within a well, the apparatus comprising:

means for ramping up a magnitude of a well voltage at said well from a start ramping time when the well voltage is at a start voltage to an end ramping time when the well voltage is at an end voltage;

means for coupling said drain node of said high voltage MOSFET to a ground node having a ground voltage for a predetermined time period after said start ramping time, said well voltage reaching an intermediate voltage at said predetermined time period after said start ramping time; and means for uncoupling said drain node of said high voltage MOSFET from said ground node at said predetermined time period after said start ramping time;

and wherein said drain node of said high voltage MOSFET has a controlled voltage, with a magnitude that is substantially equal to a magnitude of said end voltage minus a magnitude of said intermediate voltage, at said end ramping time when said well voltage is at said end voltage.

9. The apparatus of claim 8, wherein said drain node of said high voltage MOSFET is coupled to one of two select gates and sixteen word lines within said unselected block of said electrically erasable memory during an erase operation within a selected block of said electrically erasable memory.

10. The apparatus of claim 8, wherein a source node of said high voltage MOSFET is coupled to said ground node having said ground voltage, the apparatus further comprising:

means for biasing a gate node of said high voltage MOSFET with a turn-on voltage for said predetermined time period after said start ramping time such that said high voltage MOSFET is turned on to couple said drain node of said high voltage MOSFET to said ground node for said predetermined time period after said start ramping time.

11. The apparatus of claim 10, the apparatus farther comprising:

means for biasing said gate node of said high voltage MOSFET with a turn-off voltage at said predetermined time period after said start ramping time such that said high voltage MOSFET is turned off to uncouple said drain node of said high voltage MOSFET from said ground node at said predetermined time period after said start ramping time.

* * * * *